(12) United States Patent
Kim et al.

(10) Patent No.: US 11,601,609 B2
(45) Date of Patent: *Mar. 7, 2023

(54) IMAGE SENSORS AND METHODS OF OPERATING THE SAME

(71) Applicant: Samsung Electronics Co., Ltd., Suwon-si (KR)

(72) Inventors: Moo-young Kim, Suwon-si (KR); Yong-suk Choi, Suwon-si (KR); Jin-woo Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/574,962

(22) Filed: Jan. 13, 2022

(65) Prior Publication Data

US 2022/0141413 A1 May 5, 2022

Related U.S. Application Data

(63) Continuation of application No. 16/745,628, filed on Jan. 17, 2020, now Pat. No. 11,252,363.

(30) Foreign Application Priority Data

Jan. 28, 2019 (KR) .................. 10-2019-0010663

(51) Int. Cl.
*H04N 5/3745* (2011.01)
*H04N 5/357* (2011.01)
*H01L 27/146* (2006.01)

(52) U.S. Cl.
CPC ..... *H04N 5/3745* (2013.01); *H01L 27/14612* (2013.01); *H04N 5/357* (2013.01)

(58) Field of Classification Search
CPC ...... H04N 5/3745; H04N 5/357; H04N 5/378; H04N 5/3559; H04N 5/379; H01L 27/14612
See application file for complete search history.

(56) References Cited

U.S. PATENT DOCUMENTS

5,654,537 A * 8/1997 Prater ................ H04N 1/00063
348/E3.018
5,825,249 A 10/1998 Nakano
(Continued)

*Primary Examiner* — Abdelaaziz Tissire
(74) *Attorney, Agent, or Firm* — Harness, Dickey & Pierce, P.L.C.

(57) ABSTRACT

An image sensor includes a pixel array of pixels arranged in one or more rows and one or more columns, the pixel array configured to generate an image based on light being incident on one or more pixels of the pixel array. The image sensor includes pixel load circuitry connected to one column of pixels and including transistors serially connected to each other. The image sensor includes switches connected in parallel to separate, respective nodes between adjacent transistors. The image sensor includes image sensor processing circuitry configured to receive, from image processor circuitry, gain information indicating an intensity of light concurrently with an image being generated by the image sensor, and control at least one switch of the plurality of switches to be turned on/off to change an electrical path of a current that passes through the pixel load circuitry, based on the gain information.

20 Claims, 9 Drawing Sheets

(56) References Cited

U.S. PATENT DOCUMENTS

| | | | |
|---|---|---|---|
| 5,923,369 A * | 7/1999 | Merrill | H04N 5/3745 |
| | | | 348/308 |
| 5,953,060 A * | 9/1999 | Dierickx | H04N 5/3658 |
| | | | 348/E5.079 |
| 6,097,432 A | 8/2000 | Mead et al. | |
| 6,417,504 B1 | 7/2002 | Kozlowski | |
| 6,441,357 B2 | 8/2002 | Ang et al. | |
| 7,557,844 B2 | 7/2009 | Andersson | |
| 7,732,748 B2 * | 6/2010 | Johansson | H04N 3/155 |
| | | | 250/214 R |
| 7,920,194 B2 | 4/2011 | Bock | |
| 9,148,596 B1 * | 9/2015 | Sun | H04N 5/357 |
| 9,153,616 B2 | 10/2015 | Kondo | |
| 2004/0135911 A1 | 7/2004 | Nathan et al. | |
| 2006/0044412 A1 * | 3/2006 | Neaves | H04N 3/155 |
| | | | 348/E3.018 |
| 2008/0055432 A1 * | 3/2008 | Koseki | H04N 5/3658 |
| | | | 348/E5.079 |
| 2008/0143860 A1 * | 6/2008 | Sato | H04N 5/3741 |
| | | | 348/E7.001 |
| 2011/0267522 A1 * | 11/2011 | Gendai | H04N 5/378 |
| | | | 348/308 |
| 2015/0357369 A1 * | 12/2015 | Kobayashi | H01L 27/14636 |
| | | | 250/208.1 |
| 2016/0277695 A1 * | 9/2016 | Oguro | H04N 5/378 |
| 2017/0359492 A1 * | 12/2017 | Cho | H04N 3/1568 |

\* cited by examiner

IMAGE SENSORS AND METHODS OF OPERATING THE SAME

CROSS-REFERENCE TO RELATED APPLICATIONS

This application is a continuation of U.S. application Ser. No. 16/745,628, filed Jan. 17, 2020, which claims the benefit of Korean Patent Application No. 10-2019-0010663, filed on Jan. 28, 2019, in the Korean Intellectual Property Office, the disclosure of each of which is incorporated herein in its entirety by reference.

BACKGROUND

The inventive concepts relate to image sensors, and more particularly, to image sensors that fluidly adjust transconductance of a pixel load, and methods of operating the image sensors.

Image sensors can include a pixel array including a plurality of pixels, each pixel including an optoelectronic conversion device (for example, a photodiode). The pixel array can output ("generate") an electrical signal based on using electrons being generated according to the intensity of sensed light that is incident on the pixel array. To form a single image, respective electrical signals generated by the plurality of pixels may be generated and collected.

Electrons generated by an optoelectronic conversion device may obtain ("generate") thermal energy according to an ambient temperature, and kinetic energy of the electrons may increase. Electrons that randomly vibrate according to the increased kinetic energy may cause thermal noise in an image sensor that includes the optoelectronic device.

SUMMARY

The inventive concepts provide image sensors that fluidly adjust transconductance values of pixel loads by controlling a plurality of switches, and methods of operating the image sensors. Such image sensors may have reduced thermal noise in the pixels of the image sensors as a result and thus may have improved performance in generating images with improved resolution due to the reduction of thermal noise.

The inventive concepts also provide image sensors configured to reduce thermal noise associated therewith based on changing a transconductance value of a pixel load, based on a gain of an image, and methods of operating the image sensors.

According to an aspect of the inventive concepts, there is provided an image sensor including a pixel array including a plurality of pixels, the plurality of pixels arranged in one or more rows of pixels and one or more columns of pixels, the pixel array configured to generate an image based on light being incident to one or more pixels of the plurality of pixels; pixel load circuitry connected to one column of pixels of the one or more columns of pixels, the pixel load circuitry including a plurality of transistors serially connected to each other; and a plurality of switches connected in parallel to separate, respective nodes between adjacent transistors of the plurality of transistors, wherein the image sensor includes image sensor processing circuitry configured to receive, from image processor circuitry, gain information indicating an intensity of the light concurrently with the pixel array generating the image, and control at least one switch of the plurality of switches to be turned on/off to change an electrical path of a current that passes through the pixel load circuitry based on the pixel array generating the image, based on the received gain information.

According to another aspect of the inventive concepts, there is provided a method of operating an image sensor, the method including receiving, from image processor circuitry, gain information indicating an intensity of light concurrently with generation of an image at a pixel array of an image sensor based on the light being incident to one or more pixels of pixel array; and controlling at least one switch of a plurality of switches of the image sensor to be turned on/off to change an electrical path of a current that passes through pixel load circuitry of the image sensor based on the pixel array generating the image, based on the gain information, wherein the plurality of switches are connected in parallel to separate, respective nodes between adjacent transistors among a plurality of transistors of the pixel load that are serially connected to each other.

According to some example embodiments, an electronic device may include image processor circuitry and an image sensor, wherein the image processor circuitry is configured to transmit, to the image sensor, gain information indicating an intensity of light concurrently with the image sensor generating an image at a pixel array of the image sensor based on the light being incident to one or more pixels of pixel array, and the image sensor includes image sensor processing circuitry configured to control at least one switch of a plurality of switches to be turned on/off to change an electrical path of a current that passes through pixel load circuitry of the image sensor based on the pixel array generating the image, based on the gain information.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
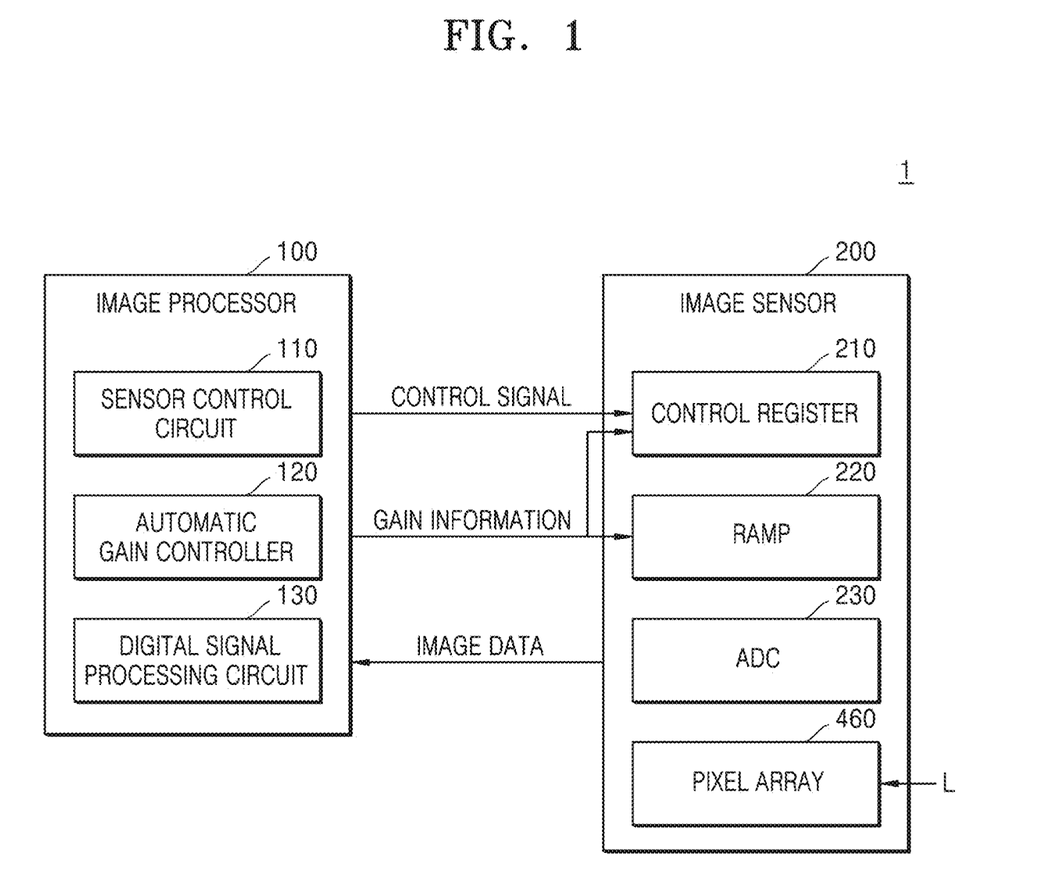
FIG. 1 is a block diagram of an image processing system according to some example embodiments of the inventive concepts.

FIG. 1 is a block diagram of an image processing system 1 according to some example embodiments of the inventive concepts.

Referring to FIG. 1, the image processing system 1 may include an image processor 100 and an image sensor 200. The image processor 100, which may also be referred to as "image processor circuitry", may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The image processor circuitry may include a memory storing a program of instructions and processing circuitry configured to execute the program of instructions to implement the functionality of some or all of the image processor 100, including some or all of the sensor control circuit 110, automatic gain controller 120, and digital signal processing circuit 130. The image processing system 1 may be included in an electronic device that includes the image processor 100 and the image sensor 200. The image processor 100 and the image sensor 200 may be configured to obtain ("generate") a still image of a subject by transmitting or receiving a control signal and image data.

According to some example embodiments, the image processor 100 may include a sensor control circuit 110, an automatic gain controller 120, and a digital signal processing circuit 130. In some example embodiments, one or more elements of the sensor control circuit 110, automatic gain controller 120, and digital signal processing circuit 130 may be implemented by processing circuitry, such as described above as being included in the image processor 100, executing a program of instructions stored on a memory device and/or storage device.

The sensor control circuit 110 may control operations of the image sensor 200. For example, the sensor control circuit 110 may transmit a control signal to a control register 210 included in the image sensor 200. In response to receiving the control signal, the control register 210 may control a plurality of components included in the image sensor 200 (for example, a timing generator, a buffer, and a counter controller).

The control signal that is transmitted from the sensor control circuit 110 to the control register 210 may be transmitted via an inter-integrated circuit (I2C) bus, but the scope of the inventive concepts is not limited thereto.

The automatic gain controller 120 may determine a gain of an image generated ("obtained") at the image sensor 200 based on conversion of light L that is detected ("received") at an optoelectronic conversion device of the pixel array 260 of the image sensor 200 to cause the optoelectronic conversion device of the pixel array 260 to generate one or more electric signals. The gain may be determined based on the intensity of the detected light at the moment when the image is obtained. For example, when received light has a large intensity (for example, when the image sensor 200 is in a bright place or outdoors), a large number ("quantity") of electrons may be generated by an optoelectronic conversion device of the pixel array 260 of the image sensor 200. Accordingly, even when the gain is amplified into a low gain (or ×1), the gain may reach a saturation input of an analog-to-digital converter (ADC) 230. As another example, when received light has a small intensity (for example, when the image sensor 200 is in a dark place or a darkroom), a small number of electrons may be generated by the optoelectronic conversion device of the pixel array 260 of the image sensor 200. Accordingly, when the gain is amplified into a high gain (e.g., ×16), the gain may reach the saturation input of the ADC 230. The determined gain may be used as a set value of a ramp 220. The automatic gain controller 120 may determine the gain by measuring the intensity of peripheral light detected at the optoelectronic conversion device of the pixel array 260 by using auto exposure.

The digital signal processing circuit 130 may process the image data that is generated at the image sensor 200 based on the electric signals generated at the optoelectronic conversion device of the pixel array 260. The digital signal processing circuit 130 may receive the image data from a buffer (for example, a buffer 280 of FIG. 2) included in the image sensor 200 and may process the received image data. For example, the digital signal processing circuit 130 may process the image data such that a display (not shown) may display an image.

Figure 2:
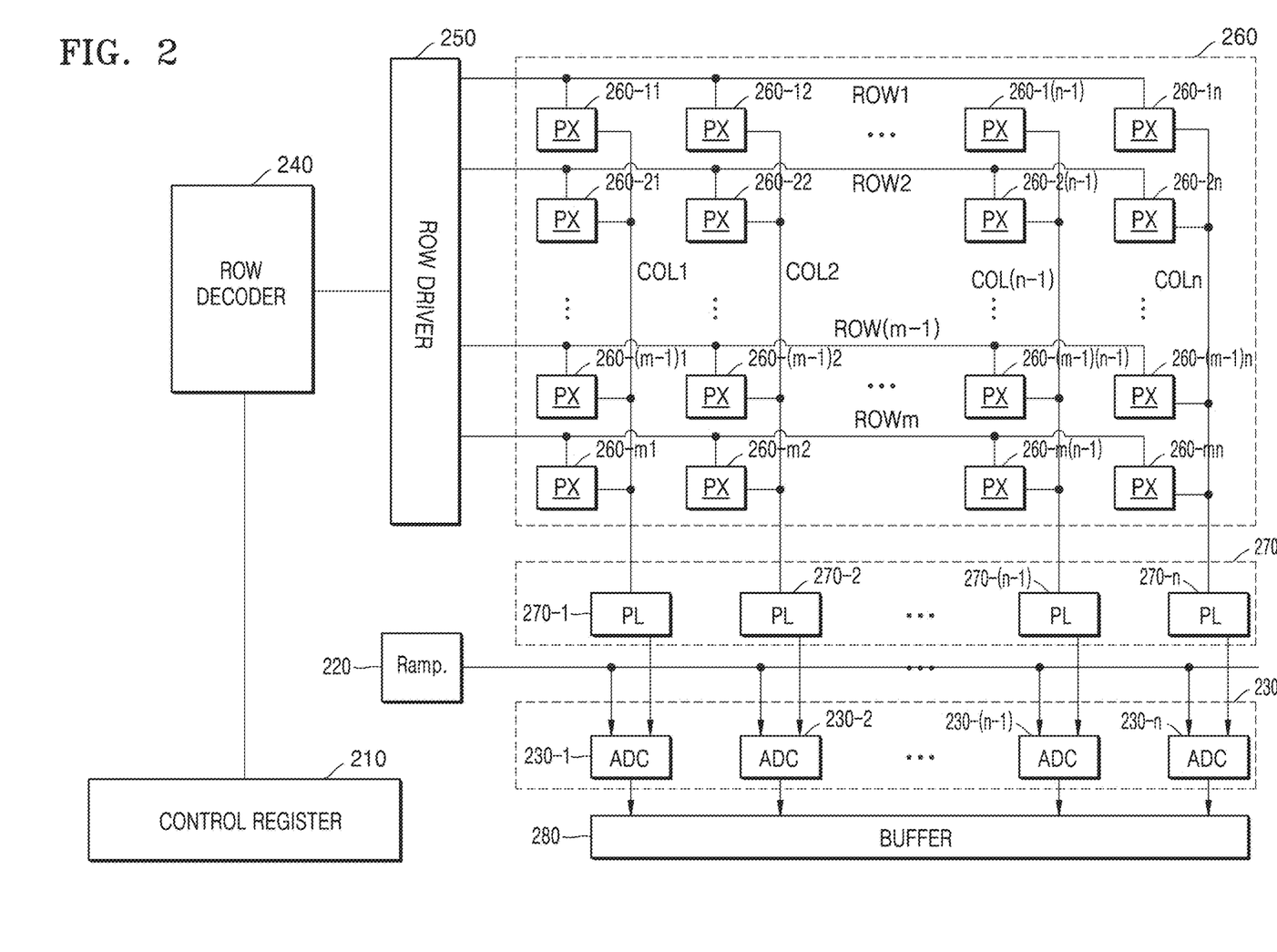
FIG. 2 is a block diagram of a structure of an image sensor according to some example embodiments of the inventive concepts.

According to some example embodiments, the image sensor 200 may include the control register 210, the ramp 220, and the ADC 230. The image sensor 200 may include the pixel array 260. The pixel array 260 may generate an image based on light L being incident upon one or more pixels of the pixel array 260, and each pixel of the pixel array 260 may include an optoelectronic conversion device. The pixels may generate an image based on one or more pixels generating an electric signal in response to light L being incident on the one or more pixels, where an optoelectronic conversion device of the one or more pixels may absorb at least some of the light L that is incident to the one or more pixels and convert the absorbed light into an electric signal. Collectively, the electric signals generated by the pixels of the pixel array 260 may be understood to be the image that is generated by the pixel array 260. The image sensor 200, including one or more elements thereof, including for example some or all of the control register 210, ramp 220, ADC 230, buffer 280, and pixel array 260, may include processing circuitry ("image sensor processing circuitry") such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, one or more elements of the image sensor 200, including for example some or all of the control register 210, ramp 220, ADC 230, buffer 280, and pixel array 260, may be implemented by processing circuitry, such as described above as being included in the image sensor 200, executing a program of instructions stored on a memory device and/or storage device. The image sensor processing circuitry may include a memory storing a program of instructions and processing circuitry configured to execute the program of instructions to implement the functionality of some or all of the image sensor 200, including some or all of the control register 210, ramp 220, ADC 230, buffer 280, and pixel array 260.

The control register 210 may output ("transmit") a control signal to each of a ramp signal generator (not shown), a timing generator (not shown), a counter controller (not shown), and the buffer 280 of FIG. 2 and may control operations thereof.

The ramp 220 may amplify a pixel output voltage of electric signals generated by one or more pixels of the pixel array 260 based on light L being incident on some or all of the pixel array 260 according to the value of the gain received from the image processor 100. For example, when an image has been obtained based on the image sensor 200 being in a very bright place (e.g., the light L has a relatively high intensity), the gain value may correspond to ×1. In this case, the ramp 220 may perform buffering. As another example, when an image is obtained based on the image sensor 200 being in a very dark place (e.g., the light L has a relatively low intensity), the gain value may correspond to ×16. In this case, the ramp 220 may amplify the pixel output voltage of electric signals generated by one or more pixels of the pixel array 260 based on light L being incident on some or all of the pixel array 260 by 16 times and apply the amplified pixel output voltage as an input voltage to the ADC 230, thereby reconstructing the image generated by the pixel array 260 such that subjects may be easily distinguished from each other within the image.

The ADC 230 may convert an analog signal to a digital signal. For example, the ADC 230 may receive, from the ramp 220, an analog signal obtained by amplifying the pixel output voltage of electric signals generated by one or more pixels of the pixel array 260 according to the value of the gain. The ADC 230 may convert the analog signal to a digital signal to thereby generate pixel data.

FIG. 2 is a block diagram of a structure of an image sensor according to some example embodiments of the inventive concepts. The image sensor 200 shown in FIG. 2 may be the image sensor 200 shown in FIG. 1. A repeated description given above with reference to FIG. 1 will be omitted.

Referring to FIG. 2, the image sensor 200 may include the control register 210 (also referred to as control register circuitry), a row decoder 240 (also referred to as row decoder circuitry), a row driver 250 (also referred to as row driver circuitry), a pixel array 260, a pixel load 270 (including pixel loads 270-1 to 270-n, also referred to as pixel load circuitry), the ramp 220 (also referred to as ramp circuitry), the ADC 230 (including ADCs 230-1 to 230-n, also referred to as ADC circuitry), and the buffer 280 (also referred to as buffer circuitry). A repeated description of the control register 210, the ramp 220, and the ADC 230 described above with reference to FIG. 1 will be omitted.

The row driver 250, which may also be referred to as "row driver circuitry", may drive the pixel array 260 in units of rows. For example, the row driver 250 may generate a transmission control signal that controls a transmit transistor 302 (see FIG. 3) of each pixel comprising the pixel array 260, a reset control signal that controls a reset transistor 303 of each pixel comprising the pixel array 260, and a selection control signal that controls a select transistor 305 of each pixel comprising the pixel array 260.

The pixel array 260 may include a plurality of optoelectronic conversion devices that are each included in a separate pixel of a plurality of pixels 260-11 to 260-mn, where "m" and "n" are each a separate positive integer. Each of the optoelectronic conversion devices may include at least one of a photodiode (PD), a photo gate, or a pinned photodiode (PDD). The pixels 260-11 to 260-mn of the pixel array 260, and thus the plurality of optoelectronic conversion devices included therein, may be arranged in a lattice shape including one or more rows of pixels and one or more columns of pixels. The pixel array 260 may sense ("detect") light by using the plurality of optoelectronic conversion devices of the pixels 260-11 to 260-mn and each optoelectronic conversion device of the pixels 260-11 to 260-mn may convert the light detected at the respective optoelectronic conversion device of the pixels 260-11 to 260-mn (e.g., light L that is incident on the respective optoelectronic conversion devices) into a separate electrical signal to thereby generate an image signal, where the image signal may be referred to as an image generated by the pixel array 260. The image signal may include the plurality of electrical signals generated simultaneously or near-simultaneously by the separate optoelectronic conversion devices of the pixels 260-11 to 260-mn of the pixel array based on detection of light at the separate optoelectronic conversion devices of the pixels 260-11 to 260-mn.

Figure 3:
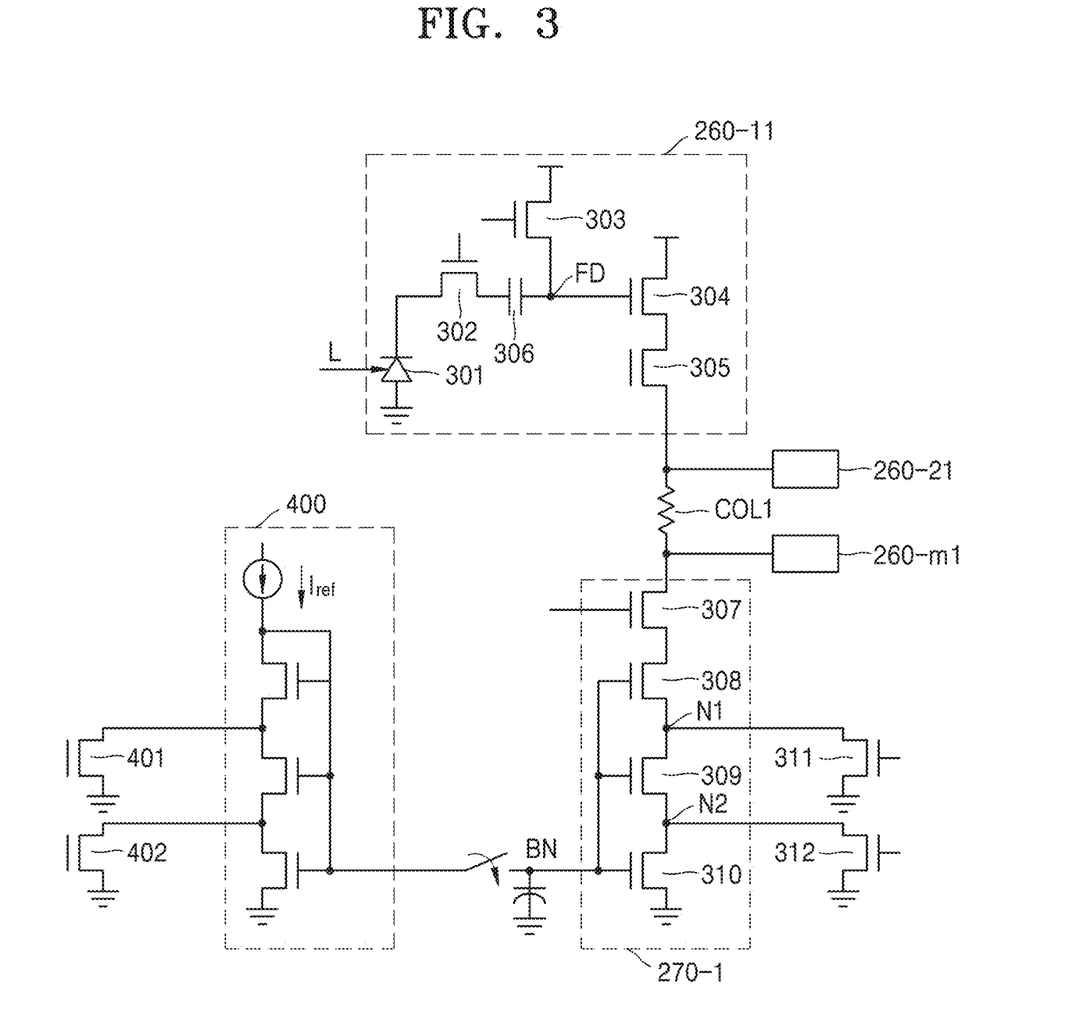
FIG. 3 is an analog circuit diagram illustrating a pixel and a pixel load according to some example embodiments of the inventive concepts.

As shown in FIG. 2, each separate pixel load 270-1 to 270-n is connected to a separate column of pixels of the one or more columns of pixels of the pixel array 260. For example, as shown in FIGS. 2-3, pixel load 270-1 is connected to column COL1 of pixels 260-11 to 260-m1, and pixel load 270-n is connected to column COLn of pixels 260-1n to 260-mn. As further described below with reference to FIG. 3, each pixel load 270-1 to 270-n includes a plurality of transistors serially connected to each other.

FIG. 3 is an analog circuit diagram illustrating a pixel and a pixel load according to some example embodiments of the inventive concepts. A repeated description given above with reference to FIG. 2 will be omitted. While the analog circuit diagram is shown for only pixel 260-11 of FIG. 2, it will be understood that similar analog circuit diagrams may be presented with regard to each of the pixels 260-11 to 260-mn.

Referring to FIG. 3, a pixel 260-11 may include an optoelectronic conversion device 301, a capacitor 306, and a plurality of transistors. According to some example embodiments, the plurality of transistors may include the transmit transistor 302, the reset transistor 303, a drive transistor (or source follower (SF)) 304, and the select transistor 305. According to some example embodiments, the optoelectronic conversion device 301 may include a PD, a photo gate, a PDD, or any combination thereof.

The optoelectronic conversion device 301 may generate a photocharge that varies according to the intensity of incident light L sensed ("detected," "received," or the like) at the optoelectronic conversion device 301. The transmit transistor 302 may transmit the generated photocharge to the capacitor 306 according to a transmission control signal that is output to the gate of the transmit transistor 302 by the row driver 250.

The capacitor 306 may accumulate the photocharge received from the transmit transistor 302. As the photocharge is accumulated, a node of the capacitor 306 may generate a voltage for driving the drive transistor 304. The node, as shown in FIG. 3, may be referred to as a floating diffusion (FD) node. The drive transistor 304 may amplify electric potential of the FD node and transmit the amplified electric potential to the select transistor 305. The select transistor 305 has a drain terminal connected to a source terminal of the drive transistor 304 and may output an electric signal, also referred to herein as a pixel signal, to a column COL1 connected to the pixel 260-11 according to a selection signal SEL output by the row driver 250 to the gate of the select transistor 305. The reset transistor 303 may reset the FD node according to a reset control signal that is output by the row driver 250 to the gate of the reset transistor 303.

According to some example embodiments, the pixel 260-11 is illustrated as including four transistors, but the inventive concepts are not limited thereto. According to some example embodiments, the pixel 260-11 may have a 3Tr structure including three transistors (reset transistor, drive transistor, and select transistor), or a 5Tr structure including five transistors.

According to some example embodiments, the description of the pixel 260-11 is equally applicable to a plurality of pixels 260-11 through 260-$mn$ included in the pixel array 260.

According to some example embodiments, a voltage component included in a pixel output voltage, of electric signals ("pixel signals") generated by a pixel, and generated due to thermal noise may be expressed as in Equation 1 below.

$$V_{n,out}^2 = \frac{2}{3} \times \left(1 + \frac{g_{m2}}{g_{m1}}\right) \times \frac{kT}{C_L} \qquad \text{[Equation 1]}$$

In Equation 1, k may correspond to a Boltzmann constant, T may correspond to an absolute temperature, $C_L$ may correspond to a capacitance viewed from a pixel output node, $g_{m1}$ may correspond to a transconductance value of a drive transistor, and $g_{m2}$ may correspond to a transconductance value of the pixel load 270-1.

Referring to Equation 1, to reduce an output voltage, of a pixel signal, that is generated due to thermal noise, a transconductance $g_{m2}$ of the pixel load 270-1 may be decreased. The transconductance $g_{m2}$ of the pixel load 270-1 may be expressed using Equation 2 below.

$$g_{m2} = \sqrt{2\beta \times I} = \sqrt{2 \times \mu_n C_{ox} \frac{W}{L} \times I} \qquad \text{[Equation 2]}$$

In Equation 2, $\mu_n$ may correspond to the mobility of electrons, $C_{ox}$ may correspond to a capacitance of a gate oxide layer, W may correspond to the width of a transistor channel, and L may correspond to the length of the transistor channel.

Referring to Equation 2, the transconductance $g_{m2}$ of the pixel load 270-1 may be proportional to a W/L ratio of a transistor. Accordingly, when the W/L ratio of the transistor is decreased, the transconductance $g_{m2}$ of the pixel load 270-1 may decrease and the voltage due to thermal noise within the pixel output voltage may decrease.

According to some example embodiments, the pixel load 270-1 may include an independent current source 307, a plurality of transistors, for example, a first transistor 308, a second transistor 309, and a third transistor 310, and a plurality of switches, for example, first and second switches 311 and 312.

According to some example embodiments, the independent current source 307 may include a transistor. By applying a bias voltage to the transistor, the independent current source 307 may be controlled to output a current of a certain magnitude. According to some example embodiments, the independent current source 307 is illustrated as including a single transistor, but example embodiments are not limited thereto. The independent current source 307 may include a plurality of cascaded transistors. By connecting the plurality of transistors to each other, the independent current source 307 may operate as an ideal current source that outputs a current of a certain magnitude regardless of an input voltage.

The first, second, and third transistors 308, 309, and 310 may be serially connected to each other to form ("define") a stack structure.

According to some example embodiments, the pixel load 270-1 may include the first and second switches 311 and 312. The first and second switches 311 and 312 may be connected to the first through third transistors 308 through 310 such that the first and second switches 311 and 312 alternate with the first through third transistors 308 through 310. As shown in FIG. 3, the switches 311 and 312 may be connected in parallel to separate, respective nodes N1 and N2 between neighboring ("adjacent") transistors of the first, second, and third transistors 308, 309, and 310. For example, the first switch 311 may be connected to a first node N1 between the first transistor 308 and the second transistor 309. For example, the second switch 312 may be connected to a second node N2 between the second transistor 309 and the third transistor 310. The first and second switches 311 and 312 may be connected to ground nodes, respectively.

According to some example embodiments, at least one switch of the first and second switches 311 and 312 may receive a control signal from the control register 210 and may be turned on or off (e.g., selectively activated or inactivated). To reduce the W/L ratio of the pixel load 270-1, the control register 210 may output a control signal instructing at least one of the first switch 311 or the second switch 312 to be inactivated. For example, when the first switch 311 is inactivated and the second switch 312 is activated, the W/L ratio of the pixel load 270-1, and thus the transconductance value of the pixel load 270-1, may be halved (e.g., reduced by about ½). As another example, when both the first switch 311 and the second switch 312 are inactivated, the W/L ratio of the pixel load 270-1, and thus the transconductance value of the pixel load 270-1, may be reduced to ⅓ (e.g., reduced by about ⅔).

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

According to some example embodiments, the image sensor 200 may further include a bias current circuit 400. The bias current circuit 400 may correspond to (e.g., may include) a current mirror circuit for generating a separate current that passes through the pixel load 270-1. Accordingly, it will be understood that the bias current circuit 400 may be configured to generate a separate current that flows to the pixel load 270-1, separately from the current that flows to the pixel load 270-1 from one or more pixels 260-11 to 260-$m1$.

The bias current circuit 400 may further include a plurality of switches 401 and 402, also referred to herein as a plurality of additional switches. As shown in FIG. 3, the plurality of switches 401 and 402 may form symmetry with (e.g., are in a symmetrical configuration with regard to) the first and second switches 311 and 312 connected to the pixel load 270-1. The plurality of switches 401 and 402 included in the bias current circuit 400 and the first and second switches 311 and 312 connected to the pixel load 270-1 may be identically controlled, such that the plurality of switches 401 and 402 may be configured to be turned on or off, identically with the plurality of switches 311 and 312. When the plurality of switches 401 and 402 included in the bias current circuit 400 are not identically controlled with the first and second switches 311 and 312 connected to the pixel load 270-1, a W/L ratio of the bias current circuit 400 does not change, whereas the W/L ratio of the pixel load 270-1 may be changed. The magnitude of a current flowing in the pixel load 270-1 may be determined based on the W/L ratios of the bias current circuit 400 and the pixel load 270-1. Accordingly, the plurality of switches 401 and 402 included in the bias current circuit 400 are controlled identically as the first and second switches 311 and 312 connected to the pixel load 270-1 in order to maintain the magnitude of the current flowing in the pixel load 270-1.

According to some example embodiments, the plurality of transistors are three transistors, but embodiments are not limited thereto. According to some example embodiments, the plurality of transistors may include n transistors. According to some example embodiments to be described later, when the pixel load 270-1 includes n transistors, the magnitude of the transconductance of the pixel load 270-1 may be scaled to 1/n, where "n" is a positive integer and may be a separate value from the "n" value of the "n" columns in the pixel array 260.

Figure 4:
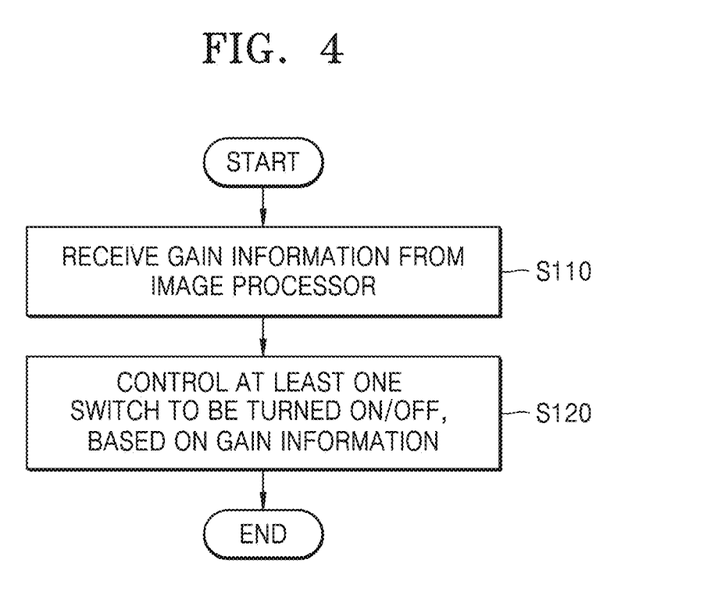
FIG. 4 is a flowchart of an operation of an image sensor according to some example embodiments of the inventive concepts.

FIG. 4 is a flowchart of an operation of an image sensor according to some example embodiments of the inventive concepts.

Referring to FIG. 4, in operation S110, the image sensor 200 may receive gain information from the image processor 100. The gain information may indicate an intensity of the light L that is incident on some or all of the pixel array 260. The gain information may be received at the image sensor at the same time or nearly the same as (e.g., concurrently with) the pixel array 260 of the image sensor 200 generating an image based on the light L being incident on some or all of the pixel array 260. In response to receiving a signal that requests image obtainment ("image generation"), for example an image capture command generated by a user interface (e.g., a button and/or touchscreen) based on user interaction with the user interface, the image processor 100 may determine a gain value based on a measured intensity of light L by performing an auto exposure operation (e.g., processing images generated by the image sensor 200 and/or sensor data generated by a light sensor device to determine an intensity of light L). For example, the determined gain value may correspond to ×1 to ×16. When the image processor 100 determines the gain value, the image processor 100 may transmit the determined gain value to the image sensor 200 as part of the gain information. The image sensor 200 may receive the gain information and may determine the gain value based on the gain information and may change the set value of the ramp 220 according to the determined gain value, concurrently with causing the pixel array 260 to generate an image. For example, when the predetermined gain value is ×16, the ramp 220 may amplify the pixel voltage by 16 times and may apply the amplified voltage as the input voltage of the ADC 230.

In operation S120, the image sensor 200 may control at least one switch of the plurality of switches (e.g., first switch 311 and second switch 312) to be turned on/off to change an electrical path of a current that passes through a pixel load based on the generation of the image by the pixel array, based on the gain information. The image sensor 200 may determine a switch which is controlled to be turned on/off, by using the gain information. For example, when the gain information indicates a gain value of ×16, light corresponding to an image obtainment time point has a very small intensity. When Vout is amplified 16 times, a thermal noise component included in Vout is also amplified by 16 times, and thus reduction of thermal noise may be important. Accordingly, the image sensor 200 may change an electrical path of the current flowing in the pixel load 270-1 and change the W/L ratio of the pixel load 270-1, by turning at least one of the plurality of switches on/off. Because thermal noise is dependent upon the W/L ratio of the pixel load 270-1, the image sensor 200 may reduce thermal noise by reducing the W/L ratio. A detailed operation of controlling at least one switch to be turned on/off will now be described with reference to FIG. 5.

Figure 5:
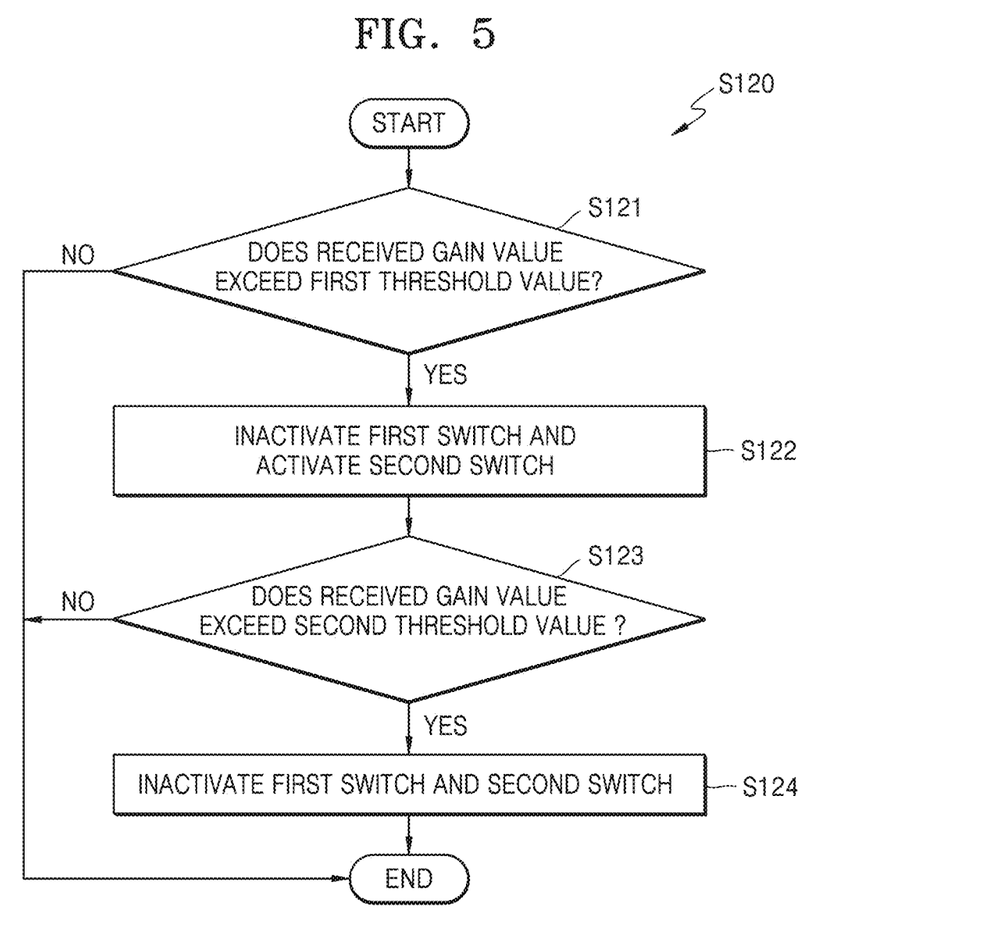
FIG. 5 is a flowchart of a method of controlling an on/off operation of a switch, according to some example embodiments of the inventive concepts.

FIG. 5 is a flowchart of a method of controlling an on/off operation of a switch, according to some example embodiments of the inventive concepts. In more detail, FIG. 5 is a flowchart of operation S120 of controlling at least one of the plurality of switches to be turned on/off, based on the gain information.

Referring to FIG. 5, in operation S121, the image sensor 200 may determine whether the received gain value exceeds a first threshold value. For example, the first threshold value may correspond to ×5. When the received gain value corresponds to ×1 to ×4, the image sensor 200 does not amplify a pixel output by five times or greater, and thus may determine thermal noise in the pixel output to not be reduced. In other words, when the image sensor 200 amplifies the pixel output by 1 to 4 times, performance degradation due to an ADC input voltage limited by reducing the W/L ratio may be greater than thermal noise reduction obtainable by reducing the W/L ratio. Accordingly, when the received gain value does not exceed the first critical value, the image sensor 200 may terminate the procedure. Restated, in response to a determination that the gain value does not exceed a first threshold value, the image sensor 200 may bypass control of the at least one switch of switches 311 and 312 to be turned on/off, thereby refraining from selectively activating or inactivating any of the switches based on the gain value in relation to at least the first threshold value.

In operation S122, the image sensor 200 may inactivate the first switch 311 and activate the second switch 312 in response to a determination that the gain value is greater than the first threshold value. In operation S121, when the received gain value exceeds the first threshold value, thermal noise may be reduced by reducing the W/L ratio, and thus at least one of the plurality of switches may be controlled to be turned on/off. For example, in response to a gain value exceeding the first threshold value, the control register 210 may output a control signal inactivating the first switch 311 and activating the second switch 312. When the first switch 311 is inactivated and the second switch 312 is activated, the current flowing in the pixel load 270-1 may pass through the first transistor 308 and the second transistor 309 and then may flow to a ground node via the second switch 312. Because the first transistor 308 and the second transistor 309 serially connected to each other to have a stack structure are equivalent to a transistor of W/2L, the W/L ratio of the pixel load 270-1 may be halved.

In operation S123, the image sensor 200 may determine whether the received gain value exceeds a second threshold value, in response to the determination that the gain value exceeds the first threshold value. The second threshold value may be greater than the first threshold value. For example, the second threshold value may correspond to ×10. When the received gain value corresponds to ×5 to ×9, the image sensor 200 does not amplify a pixel output value by ten times or greater, and thus may bypass additional reduction of the W/L ratio. In other words, when the image sensor 200 amplifies the pixel output voltage by 5 to 9 times, performance degradation due to an ADC input voltage limited due to an additionally reduced W/L ratio may be greater than thermal noise reduction obtainable by additionally reducing the W/L ratio. Accordingly, when the received gain value does not exceed the second critical value, the image sensor 200 may terminate the procedure. Restated, in response to a determination that the gain value is greater than the first threshold value and does not exceed a second threshold value, the image sensor 200 may inactivate the first switch 311 and activate the second switch 312.

In operation S124, the image sensor 200 may inactivate both the first switch 311 and the second switch 312 in response to a determination that the gain value is greater than the second threshold value. In operation S123, when the received gain value exceeds the second threshold value, thermal noise may be reduced by reducing the W/L ratio, and thus at least one of the plurality of switches may be controlled to be turned on/off. In other words, when the pixel output voltage is amplified by 10 to 16 times, a thermal noise component included in the pixel output voltage is also amplified 10 to 16 times and output, and thus thermal noise needs to be additionally reduced. For example, in response to a gain value exceeding the second threshold value, the control register 210 may output a control signal inactivating the second switch 312. When the second switch 312 is inactivated, because the first switch 311 and the second switch 312 are inactivated, the current flowing in the pixel load 270-1 may pass through the first transistor 308, the second transistor 309, and the third transistor 310. Because the first, second, and third transistors 308, 309, and 310 serially connected to each other to have a stack structure are equivalent to a transistor of W/3L, the W/L ratio of the pixel load 270-1 may be reduced to ⅓.

Figure 6A:
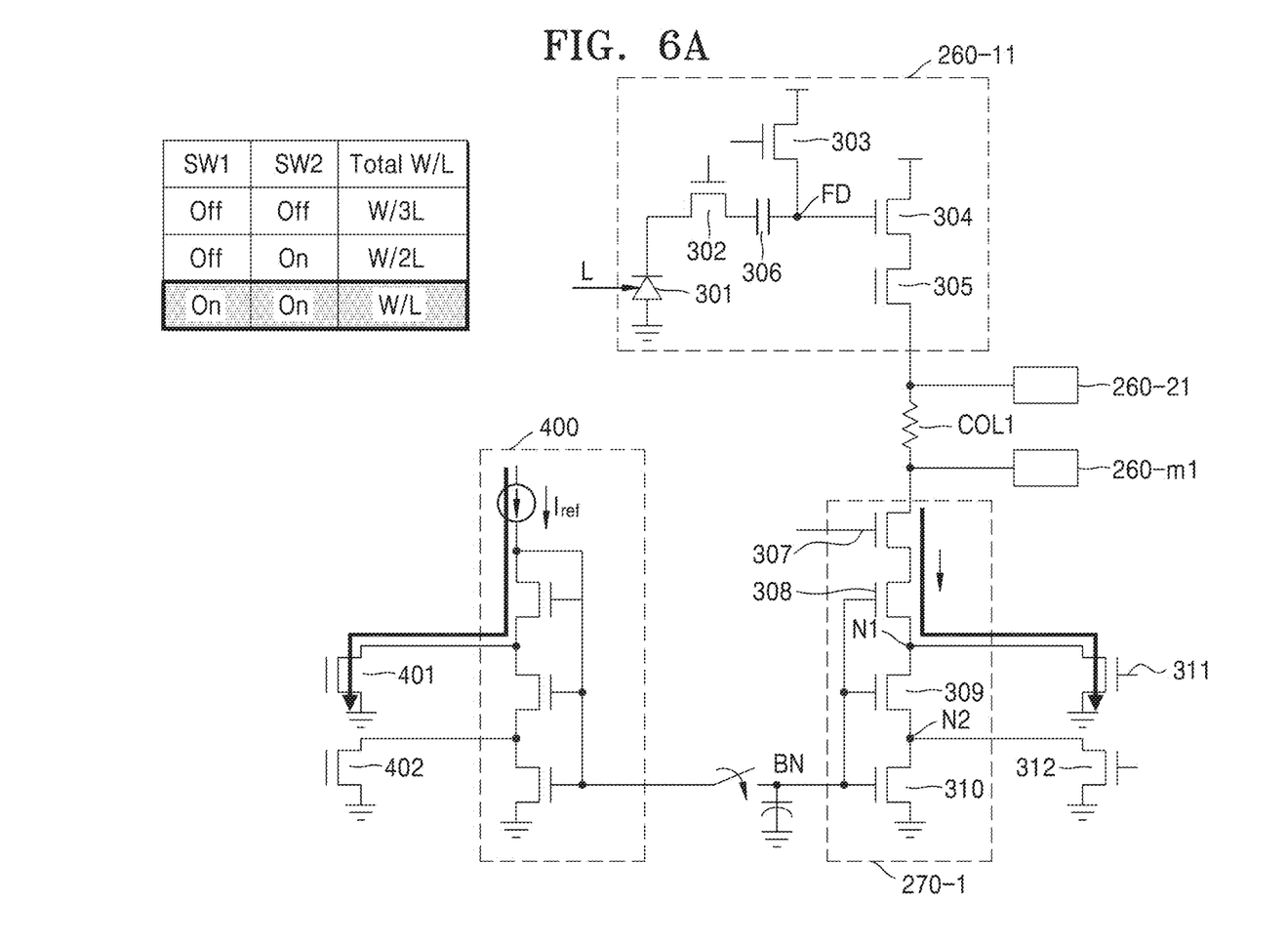
FIG. 6A is a circuit diagram illustrating a flow of a pixel load current according to control of a switch to be turned on/off, when a gain value not exceeding the first threshold value is received, according to some example embodiments of the inventive concepts.

FIG. 6A is a circuit diagram illustrating a flow of a pixel load current according to control of a switch to be turned on/off, when a gain value not exceeding the first threshold value is received, according to some example embodiments of the inventive concepts.

The image sensor 200 may receive gain information indicating the gain value not exceeding the first threshold value from the image processor 100. For example, the gain value may correspond to ×1 to ×4. The image sensor 200 may active the first switch 311 in response to the gain information. When the first switch 311 connected to a ground node is activated, the pixel load current may have an electrical path including the first transistor 308 and the first switch 311. The electrical path may correspond to a bold line. In other words, the pixel load current may pass through the first transistor 308 and the first switch 311. Restated, the image sensor 200 may direct the current flowing in the pixel load 270-1 to follow an electrical path including the first transistor 308 and the first switch 311, based on the first switch 311 being activated. Because the pixel load 270-1 through which the pixel load current passes is limited only by the first transistor 308, the W/L ratio of the pixel load 270-1 may correspond to the W/L ratio of the first transistor 308.

Figure 6B:
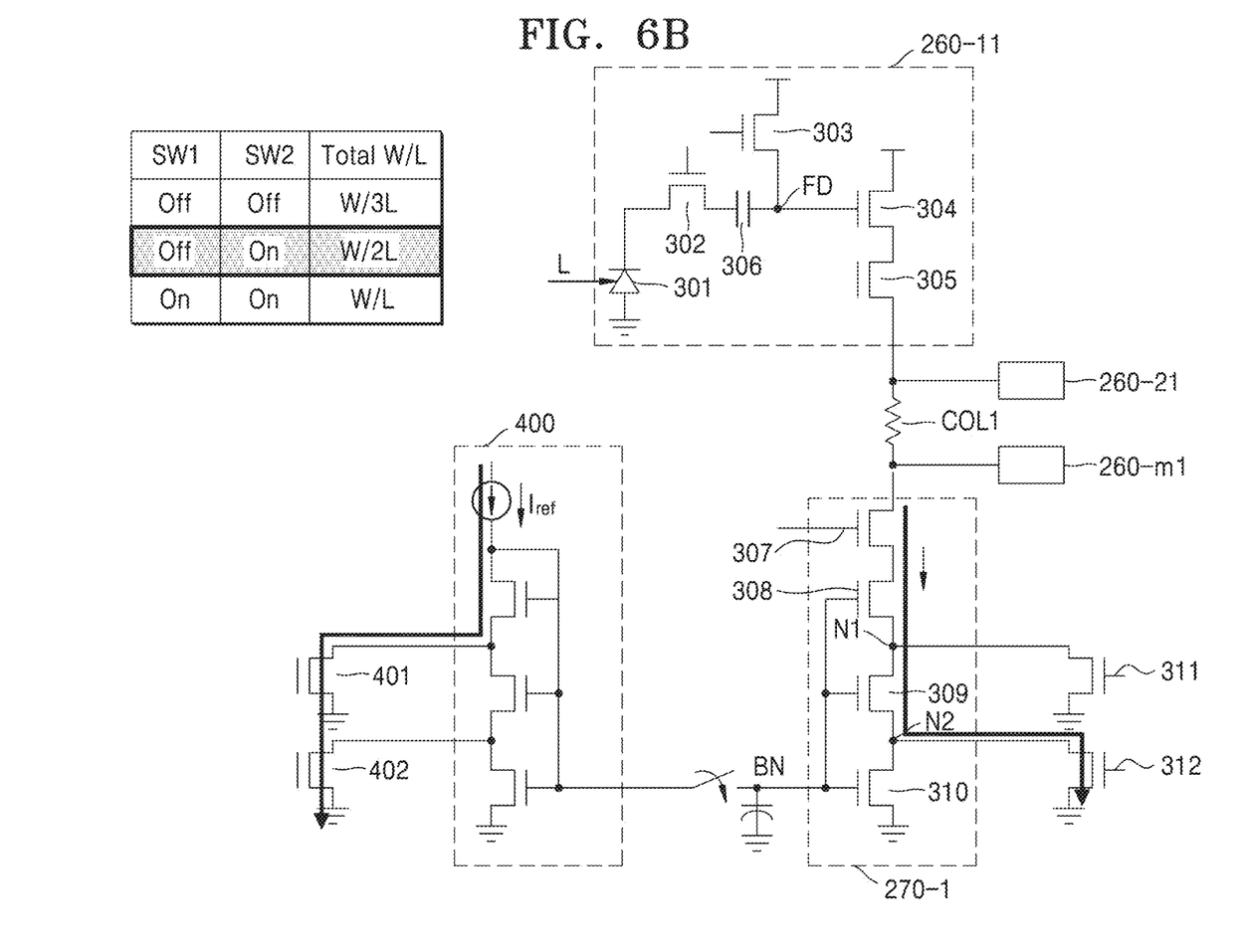
FIG. 6B is a circuit diagram illustrating a flow of a pixel load current according to control of a switch to be turned on/off, when a gain value exceeding the first threshold value and not exceeding the second threshold value is received, according to some example embodiments of the inventive concepts.

FIG. 6B is a circuit diagram illustrating a flow of a pixel load current according to control of a switch to be turned on/off, when a gain value exceeding the first threshold value and not exceeding the second threshold value is received, according to some example embodiments of the inventive concepts.

The image sensor 200 may receive gain information indicating the gain value exceeding the first threshold value and not exceeding the second threshold value from the image processor 100. For example, the gain value may correspond to ×5 to ×9. The image sensor 200 may inactivate the first switch 311 and activate the second switch 312, in response to the gain information. Because the first switch 311 in a stack structure where the plurality of transistors are formed is connected to an upper node compared than the second switch 312, when the first switch 311 is activated, the pixel load current may flow to a ground node via the first switch 311 regardless of whether the second switch 312 is activated or inactivated. Accordingly, the image sensor 200 may change an electrical path such that the pixel load current passes through at least two transistors connected to each other, by inactivating the first switch 311. The electrical path may correspond to a bold line. In other words, the pixel load current may pass through the first and second transistors 308 and 309 and the second switch 312. Restated, the image sensor 200 may direct the current flowing in the pixel load 270-1 to follow an electrical path including the first and second transistors 308 and 309 and the second switch 312, based on the first switch 311 being inactivated and the second switch 312 being activated. Because the electrical path includes the first transistor 308 and the second transistor 309, the electrical path may be a circuit equivalent to a single transistor having transconductance of the W/2L ratio. According to a halved W/L ratio, thermal noise in the pixel output voltage may be reduced.

Figure 6C:
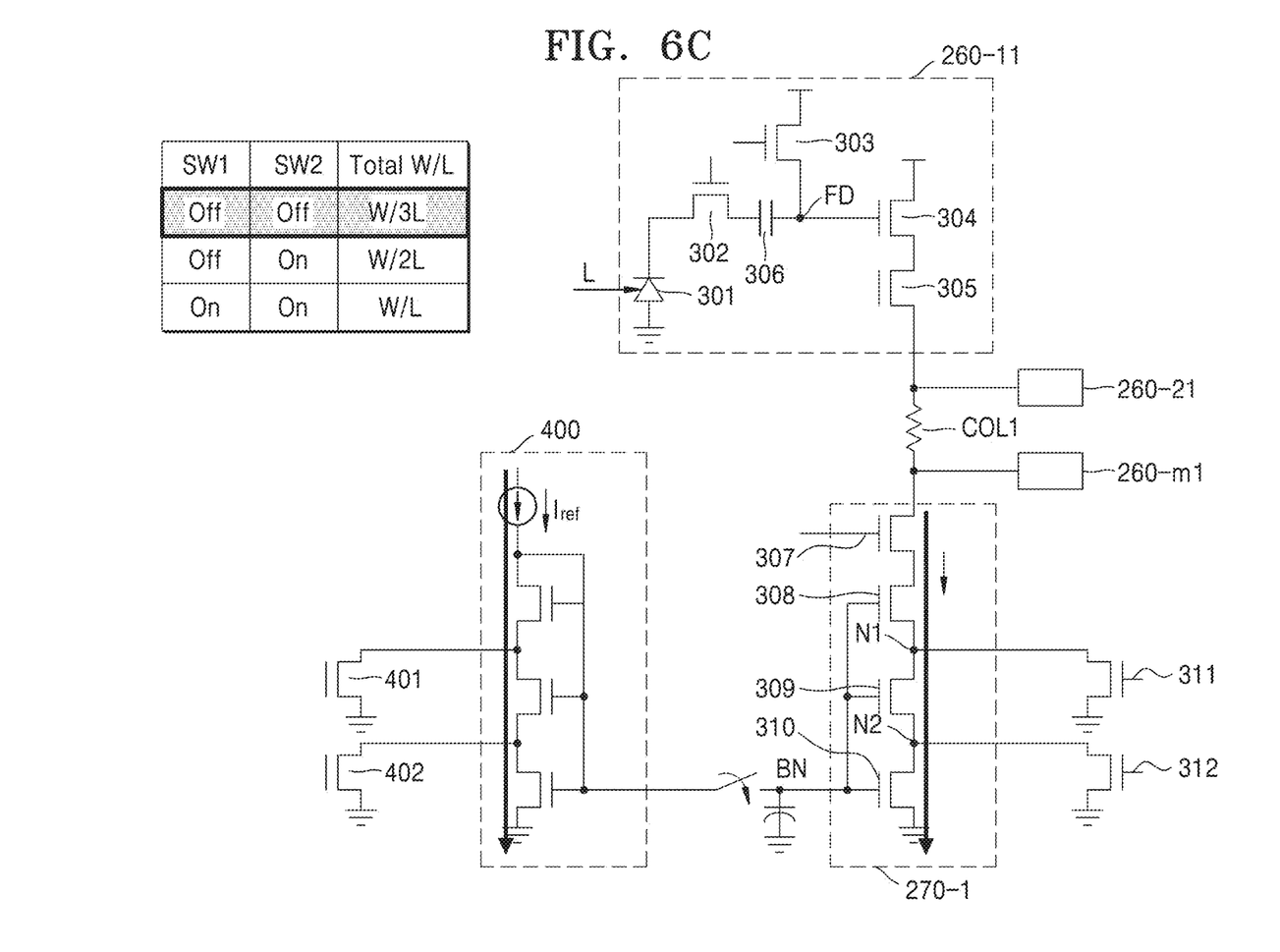
FIG. 6C is a circuit diagram illustrating a flow of a pixel load current according to control of a switch to be turned on/off, when a gain value exceeding the second threshold value is received, according to some example embodiments of the inventive concepts.

FIG. 6C is a circuit diagram illustrating a flow of a pixel load current according to control of a switch to be turned on/off, when a gain value exceeding the second threshold value is received, according to some example embodiments of the inventive concepts.

The image sensor 200 may receive gain information indicating the gain value exceeding the second threshold value from the image processor 100. For example, the gain value may correspond to ×10 to ×16. The image sensor 200 may inactivate the first switch 311 and the second switch 312 in response to the gain information. When the first switch 311 and the second switch 312 are inactivated, the pixel load current may flow to a ground node connected to the third transistor 310. Accordingly, the image sensor 200 may change an electrical path such that the pixel load current passes through at least three transistors, by inactivating the first and second switches 311 and 312. The electrical path may correspond to a bold line. The pixel load current may pass through the first, second, and third transistors 308, 309, and 310. Restated, the image sensor 200 may direct the current flowing in the pixel load 270-1 to follow an electrical path including each transistor of the first through third transistors 308, 309, and 310, based on both the first switch 311 and the second switch 312 being inactivated. Because the electrical path includes the first through third transistors 308 through 310, the electrical path may be a circuit equivalent to a single transistor having transconductance of the W/3L ratio. According to a W/L ratio reduced to ⅓, thermal noise in the pixel output voltage may be reduced.

According to some example embodiments, the pixel load 270-1 is illustrated as having three transistors and two switches, but embodiments are not limited thereto. According to some example embodiments, the pixel load 270-1 may include n transistors and (n−1) switches. As shown in FIGS. 6A through 6C, the number of transistors through which the pixel load current passes may be sequentially increased by sequentially inactivating the switches from a switch connected to an upper node to a switch connected to a lower node. As the number of transistors through which the pixel load current passes sequentially increases, the W/L ratio of the pixel load 270-1 may decrease in inverse proportion to the number of transistors. For example, the image sensor 200 may inactivate (n−1) switches, and the pixel load current may change an electrical path to pass through n transistors. In this case, an equivalent circuit of the pixel load 270-1 through which the pixel load current passes may correspond to a single transistor having a W/nL ratio.

Figure 7:
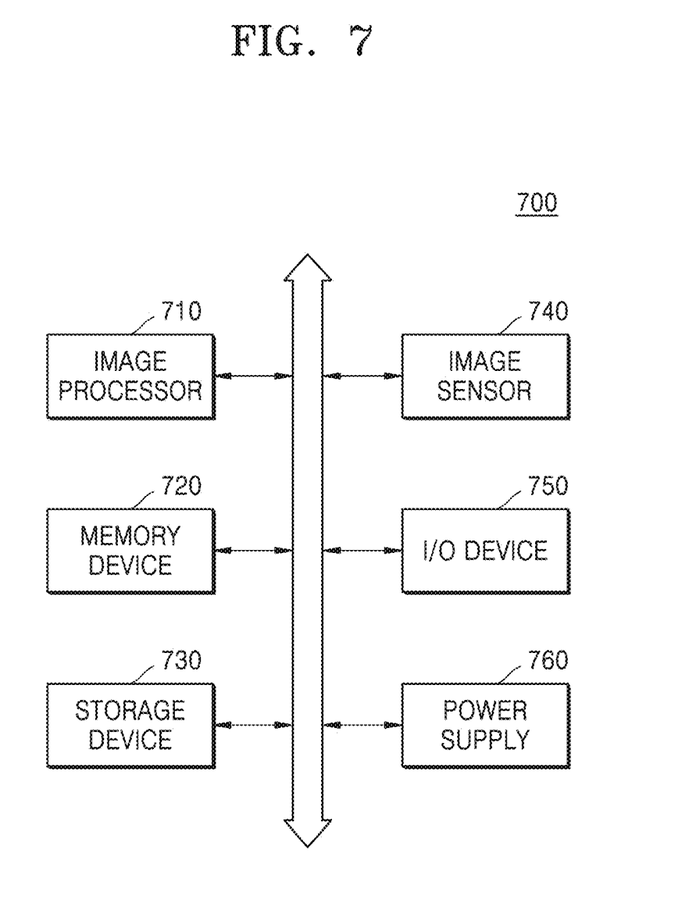
FIG. 7 is a block diagram of a computing system including an image sensor according to some example embodiments of the inventive concepts.

FIG. 7 is a block diagram of a computing system 700 including an image sensor according to some example embodiments of the inventive concepts.

Referring to FIG. 7, the computing system 700 may include an image processor 710, a memory device 720, a storage device 730, an input/output (I/O) device 750, a power supply device 760, and an image sensor 740. The image sensor 740 may include the image sensor 200 according to some example embodiments of the inventive concepts described above with reference to FIGS. 1 through 6C. The image processor 710 may include the image processor 100 according to some example embodiments of the inventive concepts described above with reference to FIGS. 1 through 6C. Although not shown in FIG. 7, the computing system 700 may further include ports which are capable of communicating with a video card, a sound card, a memory card, a USB device, or other electronic apparatuses.

The image processor 710 may execute specific calculations or specific tasks. The image processor 710 may include the image sensor 740 according to some example embodiments of the inventive concepts described above with reference to FIGS. 1 through 6C. For example, the image processor 710 may include a microprocessor or a central processing unit (CPU). The image processor 710 may communicate with the memory device 720, the storage device 730, and the I/O device 750 through an address bus, a control bus, and a data bus. For example, the image processor 710 may be connected to an expansion bus such as a peripheral component interconnect (PCI) bus. When the image processor 710 receives a digital zoom command from a host or the like, the image processor 710 may output zoom information according to the digital zoom command to the image sensor 740 via a bus.

The memory device 720 may store data necessary for operations of the computing system 700. For example, the memory device 720 may be implemented using DRAM, mobile DRAM, SRAM, or a non-volatile memory.

A chip of the DRAM, the mobile DRAM, the SRAM, and the non-volatile memory may be mounted by using various types of packages. For example, the chip may be packaged as a package, such as a package on package (POP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), or a plastic metric quad flat pack (MQFP).

The storage device 730 may include a solid state drive (SSD), a hard disk drive (HDD), a CD-ROM, and the like. The I/O device 750 may include an input device, such as a keyboard, a keypad, or a mouse, and output units, such as a printer and a display. The power supply device 760 may supply an operating voltage necessary for operations of the computing system 700.

As shown in FIG. 7, the image sensor 740 may be connected to the image processor 710 via buses or another communication link and thus perform communication with the image processor 710. According to embodiments of the inventive concepts, when the image sensor 740 receives gain information from the image processor 710, the image sensor 740 may change a transconductance value of a pixel load by turning at least one of a plurality of switches on/off, based on a comparison between the first threshold value and the second threshold value, thereby reducing thermal noise. The image sensor 740 and the image processor 710 may be integrated into a single chip, or may be integrated into different chips. The computing system 700 may be interpreted as any computing system using an image sensor. For example, the computing system 700 may include a digital camera, a mobile telephone, a personal digital assistant (PDA), a portable multimedia player (PMP), a smartphone, and a tablet PC.

The inventive concepts have been particularly shown and described with reference to example embodiments thereof. The terminology used herein is for the purpose of describing example embodiments only and is not intended to be limiting of the inventive concepts. Therefore, it will be understood by those skilled in the art that various changes in form and details may be made therein without departing from the spirit and scope of the inventive concepts as defined by the appended claims.

What is claimed is:

1. An image sensor, comprising:
   a pixel array including a plurality of pixels, the plurality of pixels arranged in one or more rows of pixels and one or more columns of pixels, the pixel array configured to generate an image based on light being incident to one or more pixels of the plurality of pixels;
   pixel load circuitry connected to one column of pixels of the one or more columns of pixels, the pixel load circuitry including a plurality of transistors serially connected to each other; and
   a switch connected to a node between the plurality of transistors,
   wherein the image sensor includes image sensor processing circuitry configured to
      receive, from image processor circuitry, gain information indicating an intensity of the light concurrently with the pixel array generating the image, and
      control the switch to be turned on/off to change an electrical path of a current that passes through the pixel load circuitry, based on the pixel array generating the image, based on the gain information.

2. The image sensor of claim 1, wherein the plurality of transistors are serially connected to each other to define a stack structure.

3. The image sensor of claim 1, wherein the plurality of transistors include a first transistor and a second transistor.

4. The image sensor of claim 3, wherein the switch is connected to a node between the first transistor and the second transistor.

5. The image sensor of claim 4, wherein the image sensor is configured to
   identify a gain value, based on the gain information,
   bypass control of the switch to be turned on/off in response to a determination that the gain value does not exceed a threshold value, and
   inactivate the switch in response to a determination that the gain value is greater than the threshold value.

6. The image sensor of claim 5, wherein
   the image sensor processing circuitry is configured to direct the current flowing in the pixel load circuitry to follow an electrical path including the first transistor and the switch, based on the switch being activated.

7. The image sensor of claim 5, wherein
   the image sensor processing circuitry is configured to direct the current flowing in the pixel load circuitry to follow an electrical path including the first and second transistors, based on the switch being inactivated.

8. The image sensor of claim 5, wherein the image sensor processing circuitry is configured to cause a transconductance value of the pixel load circuitry to be reduced based on the switch being inactivated.

9. The image sensor of claim 1, further comprising: a bias current circuit configured to generate a separate current that flows to the pixel load circuitry.

10. The image sensor of claim 9, wherein the bias current circuit includes a current mirror circuit.

11. The image sensor of claim 10, wherein the bias current circuit includes an additional switch that is in a symmetrical configuration with regard to the switch, and the additional switch is configured to be turned on or off, identically with the switch.

12. An electronic device, comprising: image processor circuitry and an image sensor, wherein
the image processor circuitry is configured to transmit, to the image sensor, gain information indicating an intensity of light concurrently with the image sensor generating an image at a pixel array of the image sensor based on the light being incident to one or more pixels of pixel array, and
the image sensor includes image sensor processing circuitry configured to control a switch to be turned on/off to change an electrical path of a current that passes through pixel load circuitry of the image sensor based on the pixel array generating the image, based on the gain information.

13. The electronic device of claim 12, wherein
the pixel array includes a plurality of pixels, the plurality of pixels arranged in one or more rows of pixels and one or more columns of pixels, the pixel array configured to generate an image based on light being incident to one or more pixels of the plurality of pixels,
the pixel load circuitry is connected to one column of pixels of the one or more columns of pixels, the pixel load circuitry including a plurality of transistors serially connected to each other and
the switch is connected to a node between the plurality of transistors.

14. The electronic device of claim 13, wherein the plurality of transistors include a first transistor and a second transistor.

15. The electronic device of claim 14, wherein the switch is connected to a node between the first transistor and the second transistor.

16. The electronic device of claim 15, wherein the image sensor is configured to
identify a gain value, based on the gain information,
bypass control of the switch to be turned on/off in response to a determination that the gain value does not exceed a threshold value, and
inactivate the switch in response to a determination that the gain value is greater than the threshold value.

17. The electronic device of claim 16, wherein
the image sensor processing circuitry is configured to direct the current flowing in the pixel load circuitry to follow an electrical path including the first transistor and the switch, based on the switch being activated.

18. The electronic device of claim 16, wherein
the image sensor processing circuitry is configured to direct the current flowing in the pixel load circuitry to follow an electrical path including the first and second transistors, based on the switch being inactivated.

19. The electronic device of claim 16, wherein
the image sensor processing circuitry is configured to cause a transconductance value of the pixel load circuitry to be reduced based on the switch being inactivated.

20. A method of operating an image sensor, the method comprising:
receiving, from image processor circuitry, gain information indicating an intensity of light concurrently with generation of an image at a pixel array of the image sensor based on the light being incident to one or more pixels of pixel array; and
controlling a switch of the image sensor to be turned on/off to change an electrical path of a current that passes through pixel load circuitry of the image sensor based on the pixel array generating the image, based on the gain information,
wherein the switch is connected to a node between a plurality of transistors of the pixel load circuitry that are serially connected to each other.

* * * * *